(12) United States Patent
Zheng et al.

(10) Patent No.: US 7,749,563 B2
(45) Date of Patent: *Jul. 6, 2010

(54) TWO-LAYER FILM FOR NEXT GENERATION DAMASCENE BARRIER APPLICATION WITH GOOD OXIDATION RESISTANCE

(75) Inventors: Yi Zheng, San Jose, CA (US); Srinivas D. Nemani, Sunnyvale, CA (US); Li-Qun Xia, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1000 days.

This patent is subject to a terminal disclaimer.

(21) Appl. No.: 10/266,551

(22) Filed: Oct. 7, 2002

(65) Prior Publication Data

US 2004/0067308 A1 Apr. 8, 2004

(51) Int. Cl.
*C23C 16/00* (2006.01)
(52) U.S. Cl. .............. 427/249.15; 427/569; 427/248.1; 427/578; 427/402; 427/419.7
(58) Field of Classification Search ....................... None
See application file for complete search history.

(56) References Cited

U.S. PATENT DOCUMENTS

| | | | |
|---|---|---|---|
| 3,510,369 A | 5/1970 | Emick et al. | |
| 4,262,631 A | 4/1981 | Kubacki | 118/723 |
| 4,532,150 A | 7/1985 | Endo et al. | 427/39 |
| 4,634,601 A | 1/1987 | Hamakawa et al. | 427/39 |
| 4,759,947 A | 7/1988 | Ishihara et al. | 427/38 |
| 4,894,352 A | 1/1990 | Lane et al. | |
| 4,895,734 A | 1/1990 | Yoshida et al. | |
| 4,951,601 A | 8/1990 | Maydan et al. | |
| 5,003,178 A | 3/1991 | Livesay | |
| 5,011,706 A | 4/1991 | Tarhay et al. | |
| 5,086,014 A | 2/1992 | Miyata et al. | |
| 5,224,441 A | 7/1993 | Felts et al. | |
| 5,238,866 A | 8/1993 | Bolz et al. | 437/100 |

(Continued)

FOREIGN PATENT DOCUMENTS

DE 41 26 759 2/1993

(Continued)

OTHER PUBLICATIONS

Omar, M.A., "Elementary Solid State Physics: Principles and Applications," Lowell Technological Institute, Addison-Wesley Publishing Company, © 1975, pp. 124, 125.

(Continued)

*Primary Examiner*—David Turocy
(74) *Attorney, Agent, or Firm*—Patterson & Sheridan, LLP

(57) ABSTRACT

A method is provided for processing a substrate including providing a processing gas comprising an organosilicon compound comprising a phenyl group to the processing chamber, and reacting the processing gas to deposit a low k silicon carbide barrier layer useful as a barrier layer in damascene or dual damascene applications with low k dielectric materials. A method is provided for depositing a silicon carbide cap layer that has substantially no phenyl groups attached to silicon atoms from a processing gas comprising an oxygen-free organosilicon compound on a low k silicon carbide barrier layer.

31 Claims, 3 Drawing Sheets

U.S. PATENT DOCUMENTS

| | | | |
|---|---|---|---|
| 5,242,530 A | 9/1993 | Batey et al. | |
| 5,298,597 A | 3/1994 | You et al. | |
| 5,360,491 A | 11/1994 | Carey et al. | |
| 5,465,680 A | 11/1995 | Loboda | 117/84 |
| 5,468,978 A | 11/1995 | Dowben | |
| 5,480,300 A | 1/1996 | Okoshi et al. | |
| 5,494,712 A | 2/1996 | Hu et al. | |
| 5,554,570 A | 9/1996 | Maeda et al. | 437/235 |
| 5,565,084 A | 10/1996 | Lee et al. | |
| 5,591,566 A | 1/1997 | Ogawa | |
| 5,628,828 A | 5/1997 | Kawamura et al. | |
| 5,638,251 A | 6/1997 | Goel et al. | |
| 5,641,607 A | 6/1997 | Ogawa et al. | |
| 5,658,834 A | 8/1997 | Dowben | |
| 5,691,209 A | 11/1997 | Liberkowski | |
| 5,710,067 A | 1/1998 | Foote et al. | |
| 5,711,987 A | 1/1998 | Bearinger et al. | 427/7 |
| 5,730,792 A | 3/1998 | Camilletti et al. | 106/287.14 |
| 5,741,626 A | 4/1998 | Jain et al. | |
| 5,776,235 A | 7/1998 | Camilletti et al. | 106/287.1 |
| 5,780,163 A | 7/1998 | Camilletti et al. | 428/446 |
| 5,789,316 A | 8/1998 | Lu | |
| 5,789,776 A | 8/1998 | Lancaster et al. | |
| 5,817,579 A | 10/1998 | Ko et al. | |
| 5,818,071 A | 10/1998 | Loboda et al. | 257/77 |
| 5,855,681 A | 1/1999 | Maydan et al. | |
| 5,869,396 A | 2/1999 | Pan et al. | |
| 5,876,891 A | 3/1999 | Takimoto et al. | |
| 5,926,740 A | 7/1999 | Forbes et al. | |
| 5,989,998 A | 11/1999 | Sugahara et al. | 438/623 |
| 6,051,321 A | 4/2000 | Lee et al. | 428/447 |
| 6,054,379 A | 4/2000 | Yau et al. | 438/623 |
| 6,057,251 A | 5/2000 | Goo et al. | |
| 6,060,132 A | 5/2000 | Lee | |
| 6,068,884 A | 5/2000 | Rose et al. | 427/255.6 |
| 6,071,809 A | 6/2000 | Zhao | |
| 6,072,227 A | 6/2000 | Yau et al. | 257/642 |
| 6,080,526 A | 6/2000 | Yang et al. | |
| 6,103,590 A * | 8/2000 | Swanson et al. | 438/409 |
| 6,107,192 A | 8/2000 | Subrahmanyan et al. | |
| 6,140,226 A | 10/2000 | Grill et al. | 438/637 |
| 6,147,009 A * | 11/2000 | Grill et al. | 438/780 |
| 6,159,871 A | 12/2000 | Loboda et al. | 438/786 |
| 6,169,039 B1 | 1/2001 | Lin et al. | |
| 6,242,339 B1 | 6/2001 | Aoi | |
| 6,242,530 B1 | 6/2001 | Konig et al. | |
| 6,287,990 B1 | 9/2001 | Cheung et al. | 438/780 |
| 6,291,334 B1 | 9/2001 | Somekh | |
| 6,303,523 B2 | 10/2001 | Cheung et al. | 438/780 |
| 6,312,793 B1 | 11/2001 | Grill et al. | 428/312.6 |
| 6,316,167 B1 | 11/2001 | Angelopoulos et al. | |
| 6,340,435 B1 | 1/2002 | Bjorkman et al. | 216/72 |
| 6,340,628 B1 | 1/2002 | Van Cleemput et al. | |
| 6,344,693 B1 | 2/2002 | Kawahara et al. | |
| 6,348,725 B2 | 2/2002 | Cheung et al. | 257/642 |
| 6,352,945 B1 | 3/2002 | Matsuki et al. | |
| 6,365,527 B1 | 4/2002 | Yang et al. | |
| 6,383,955 B1 | 5/2002 | Matsuki et al. | |
| 6,399,489 B1 | 6/2002 | M'Saad et al. | |
| 6,410,462 B1 | 6/2002 | Yang et al. | |
| 6,410,463 B1 | 6/2002 | Matsuki | |
| 6,413,583 B1 | 7/2002 | Moghadam et al. | 427/249.15 |
| 6,432,846 B1 | 8/2002 | Matsuki | |
| 6,436,824 B1 * | 8/2002 | Chooi et al. | 438/687 |
| 6,437,443 B1 | 8/2002 | Grill et al. | |
| 6,444,136 B1 | 9/2002 | Liu et al. | |
| 6,444,568 B1 | 9/2002 | Sundararajan et al. | |
| 6,455,445 B2 | 9/2002 | Matsuki | |
| 6,465,366 B1 | 10/2002 | Nemani et al. | |
| 6,479,110 B2 | 11/2002 | Grill et al. | |
| 6,500,773 B1 | 12/2002 | Gaillard et al. | |
| 6,532,150 B2 | 3/2003 | Sivertsen et al. | |
| 6,548,690 B2 | 4/2003 | Mimoun | |
| 6,548,899 B2 | 4/2003 | Ross | |
| 6,555,476 B1 | 4/2003 | Olsen et al. | |
| 6,573,193 B2 | 6/2003 | Yu et al. | |
| 6,582,777 B1 | 6/2003 | Ross et al. | |
| 6,583,048 B1 | 6/2003 | Vincent et al. | |
| 6,592,890 B1 | 7/2003 | Green | |
| 6,593,633 B2 | 7/2003 | Jan et al. | |
| 6,593,653 B2 | 7/2003 | Sundararajan et al. | |
| 6,593,655 B1 | 7/2003 | Loboda et al. | |
| 6,624,053 B2 | 9/2003 | Passemard | |
| 6,649,531 B2 | 11/2003 | Cote et al. | |
| 6,660,663 B1 | 12/2003 | Cheung et al. | |
| 6,730,593 B2 | 5/2004 | Yau et al. | |
| 6,734,115 B2 | 5/2004 | Cheung et al. | |
| 6,759,327 B2 * | 7/2004 | Xia et al. | 438/643 |
| 6,838,393 B2 | 1/2005 | Yim et al. | |
| 2001/0030369 A1 * | 10/2001 | MacNeil et al. | 257/760 |
| 2002/0037648 A1 | 3/2002 | Nishizawa | |
| 2002/0045361 A1 | 4/2002 | Cheung et al. | |
| 2002/0093075 A1 | 7/2002 | Gates et al. | |
| 2002/0111042 A1 | 8/2002 | Yau et al. | |
| 2002/0119250 A1 * | 8/2002 | Campana et al. | 427/255.28 |
| 2002/0155386 A1 | 10/2002 | Xu et al. | |
| 2002/0160626 A1 | 10/2002 | Matsuki et al. | |
| 2002/0172766 A1 | 11/2002 | Laxman et al. | |
| 2003/0001282 A1 | 1/2003 | Meynen et al. | |
| 2003/0003765 A1 | 1/2003 | Gibson, Jr. et al. | |
| 2003/0003768 A1 | 1/2003 | Cho et al. | |
| 2003/0040195 A1 | 2/2003 | Chang et al. | |
| 2003/0042605 A1 | 3/2003 | Andideh et al. | |
| 2003/0064154 A1 | 4/2003 | Laxman et al. | |
| 2003/0068881 A1 | 4/2003 | Xia et al. | |
| 2003/0089988 A1 | 5/2003 | Matsuura | |
| 2003/0111730 A1 | 6/2003 | Takeda et al. | |
| 2003/0129827 A1 | 7/2003 | Lee et al. | |
| 2003/0139035 A1 | 7/2003 | Yim et al. | |
| 2003/0194496 A1 | 10/2003 | Xu et al. | |
| 2005/0042889 A1 | 2/2005 | Lee et al. | |

FOREIGN PATENT DOCUMENTS

| | | |
|---|---|---|
| DE | 196 54 737 | 12/1996 |
| DE | 199 04 311 | 8/1999 |
| EP | 0 613 178 A2 | 8/1994 |
| EP | 0 725 440 | 8/1996 |
| EP | 0 935 283 | 8/1999 |
| EP | 1 029 728 | 8/2000 |
| EP | 1 107 303 | 6/2001 |
| EP | 1 122 770 | 8/2001 |
| EP | 1 176 226 A1 | 1/2002 |
| JP | 09-008031 | 1/1997 |
| JP | 09 320 075 | 12/1997 |
| WO | WO 99/33102 | 7/1999 |
| WO | WO 99/41423 | 8/1999 |
| WO | WO 00/19498 A1 | 4/2000 |
| WO | WO 00/19508 | 4/2000 |
| WO | WO 00/20900 | 4/2000 |
| WO | WO 00/20900 A2 | 4/2000 |
| WO | WO 00/20900 A3 | 4/2000 |
| WO | WO 03/043073 A2 | 5/2003 |

OTHER PUBLICATIONS

Fukuda, et al. "Highly Reliable SiOF Film Formation by ECR-CVD Using SiF2H2", Symposium on VLSI Technology Digest of Technical Papers IEEE (1996) pp. 114-115.

PCT International Search Report and Written Opinion for PCT/US2004/000374, dated Jun. 18, 2004.

V. Cech, et al. "Thin Plasma-Polymerized Films of Dichloro(Methyl)Phenylsilane" Czechoslovak Journal of Physics, vol. 50 (2000), Suppl. S3 pp. 356-364.

Written Opinion, for US99/22424, dated Apr. 5, 2001.

PCT International Search Report for US02/40034 dated May 19, 2003.
PCT International Search Report for US99/22425 dated Feb. 11, 2000.
PCT International Search Report for US02/36229 dated Sep. 3, 2003.
Ogawa et al., "Novel ARC Optimization Methodology for KrF Excimer Laser Lithography at Low K1 Factor", Proceedings of the SPIE. Optical/Laser Microlithography V, vol. 1674, 1992, pp. 362-375.
Dijkstra et al., "Optimization of Anti-Reflection Layers for Deep UV Lithography", Proceedings of SPIE Optical/Laser Microlithography, Bellingham, SPIE, vol. 1927, 1993 pp. 275-286.
Wu, et al., "Advanced Metal Barrier Free Cu Damascene Interconnects with PECVD Silicon Carbide Barriers for 90/65-nm BEOL Technology", 2002 IEEE, IEDM pp. 595-598.
U.S. Appl. No. 09/270,039, filed Mar. 16, 1999, Huang.
PCT International Search Report, dated Oct. 21, 2004.
Lee, et al., U.S. Appl. No. 10/196,498, filed Jul. 15, 2002.
Xia, et al., U.S. Appl. No. 10/010,950, filed Nov. 13, 2001.
Cheung et al., U.S. Appl. No. 09/957,681, filed Sep. 19, 2001.
Cheung et al., U.S. Appl. No. 09/957,551, filed Sep. 19, 2001.
Xia, et al., U.S. Appl. No. 09/820,439, filed Mar. 28, 2001.
Gaillard et al., U.S. Appl. No. 09/679,843, filed Oct. 5, 2000.
Xu, et al., U.S. Appl. No. 09/657,392, filed Sep. 8, 2000.
Gaillard, et al., U.S. Appl. No. 09/638,803, filed Aug. 12, 2000.
Cheung et al., U.S. Appl. No. 09/594,187, filed Jun. 13, 2000.
Cheung et al., U.S. Appl. No. 09/594,186, filed Jun. 13, 2000.
Cheung et al., U.S. Appl. No. 09/580,505, filed May 25, 2000.
Cheung et al., U.S. Appl. No. 09/579,819, filed May 25, 2000.
Huang et al., U.S. Appl. No. 09/553,461, filed Apr. 19, 2000.
Yau et al., U.S. Appl. No. 09/477,126, filed Dec. 30, 1999.
Yau et al., U.S. Appl. No. 09/465,233, filed Dec. 16, 1999.
Yau et al., U.S. Appl. No. 09/370,371, filed Aug. 9, 1999.
Search Report from the Austrian Patent Office for Application No. 2005-01514-4, dated Jan. 27, 2006.
First Office Action issued by the State Intellectual Property Office of the People's Republic of China on Apr. 4, 2008 (Application No. 200380100469.2).
Notice of Grant of a Patent Right for an Invention and Notice of Registration issued Mar. 6, 2009 in Chinese Patent Application No. 2003801004692.
Examination Report dated Jun. 30, 2009 for European Patent Application No. 03773166.8.

\* cited by examiner

TWO-LAYER FILM FOR NEXT GENERATION DAMASCENE BARRIER APPLICATION WITH GOOD OXIDATION RESISTANCE

BACKGROUND OF THE INVENTION

1. Field of the Invention

The invention relates to the fabrication of integrated circuits, more specifically to a process for depositing dielectric layers on a substrate, and to the structures formed by the dielectric layer. The invention further relates to a process for depositing barrier layers on a substrate, and to the structures formed by the barrier layers.

2. Description of the Related Art

Semiconductor device geometries have dramatically decreased in size since such devices were first introduced several decades ago. Since then, integrated circuits have generally followed the two year/half-size rule (often called Moore's Law), which means that the number of devices that will fit on a chip doubles every two years. Today's fabrication plants are routinely producing devices having 0.35 µm and even 0.18 µm feature sizes, and tomorrow's plants soon will be producing devices having even smaller geometries.

To further reduce the size of devices on integrated circuits, it has become necessary to use conductive materials having low resistivity and to use insulators having low dielectric constants (dielectric constants of less than 4.0) to also reduce the capacitive coupling between adjacent metal lines. Such low k materials include silicon oxycarbide deposited by a chemical vapor deposition process and silicon carbide, both of which may be used as dielectric materials in fabricating damascene features.

One conductive material having a low resistivity is copper and its alloys, which have become the materials of choice for sub-quarter-micron interconnect technology because copper has a lower resistivity than aluminum, (1.7 µΩ-cm compared to 3.1 µΩ-cm for aluminum), a higher current and higher carrying capacity. These characteristics are important for supporting the higher current densities experienced at high levels of integration and increased device speed. Further, copper has a good thermal conductivity and is available in a highly pure state.

One difficulty in using copper in semiconductor devices is that copper is difficult to etch and achieve a precise pattern. Etching copper using traditional deposition/etch processes for forming interconnects has been less than satisfactory. Therefore, new methods of manufacturing interconnects having copper containing materials and low k dielectric materials are being developed.

One method for forming vertical and horizontal interconnects is by a damascene or dual damascene method. In the damascene method, one or more dielectric materials, such as the low k dielectric materials, are deposited and pattern etched to form the vertical interconnects, e.g., vias, and horizontal interconnects, e.g., lines. Conductive materials, such as copper containing materials, and other materials, such as barrier layer materials used to prevent diffusion of copper containing materials into the surrounding low k dielectric, are then inlaid into the etched pattern. Any excess copper containing materials and excess barrier layer material external to the etched pattern, such as on the field of the substrate, is then removed.

However, low k dielectric materials are often porous and susceptible to interlayer diffusion of conductive materials, such as copper, which can result in the formation of short-circuits and device failure. Furthermore, low k dielectric materials are often susceptible to oxidation. A dielectric barrier layer material is often disposed between the copper material and surrounding the low k material to prevent interlayer diffusion. However, traditional dielectric barrier layer materials, such as silicon nitride, often have high dielectric constants of 7 or greater. The combination of such a high k dielectric material with surrounding low k dielectric materials results in dielectric stacks having a higher than desired dielectric constant.

Therefore, there remains a need for an improved process for depositing dielectric barrier layer materials with low dielectric constants and good resistance to oxidation for damascene applications.

SUMMARY OF THE INVENTION

Aspects of the invention generally provide a method for depositing a barrier layer having a low dielectric constant and a cap layer over the barrier layer. In one aspect, the invention provides a method for processing a substrate including depositing a silicon carbide barrier layer on the substrate by introducing a processing gas comprising an organosilicon compound into a processing chamber, wherein the organosilicon compound has the formula $SiH_a(CH_3)_b(C_6H_5)_c$, wherein a is 0 to 3, b is 0 to 3, and c is 1 to 4, and reacting the processing gas to deposit the barrier layer, wherein the barrier layer has a dielectric constant less than 4 and contains phenyl groups attached to silicon atoms, and depositing a silicon carbide cap layer on the barrier layer by introducing a second processing gas mixture comprising an oxygen-free organosilicon compound into the processing chamber, and reacting the second processing gas mixture to deposit the silicon carbide cap layer, wherein the silicon carbide cap layer has substantially no phenyl groups attached to silicon atoms.

In another aspect, a method is provided for processing a substrate including depositing a silicon carbide barrier layer on the substrate by introducing a first processing gas mixture comprising a first organosilicon compound into a processing chamber, wherein the first organosilicon compound has the formula $SiH_a(CH_3)_b(C_6H_5)_c$, wherein a is 0 to 3, b is 0 to 3, and c is 1 to 4, and reacting the processing gas to deposit the barrier layer, wherein the barrier layer has a dielectric constant of less than 4, and depositing a silicon carbide cap layer on the barrier layer by introducing a second processing gas mixture comprising a second organosilicon compound having the formula $SiH_x(CH_3)_y(C_2H_5)_z$, wherein x is 1 to 3, y is 0 to 3, and z is 0 to 3 into the processing chamber, and reacting the second processing gas mixture to deposit the silicon carbide cap layer.

BRIEF DESCRIPTION OF THE DRAWINGS

So that the manner in which the above aspects of the invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

Figure 1:
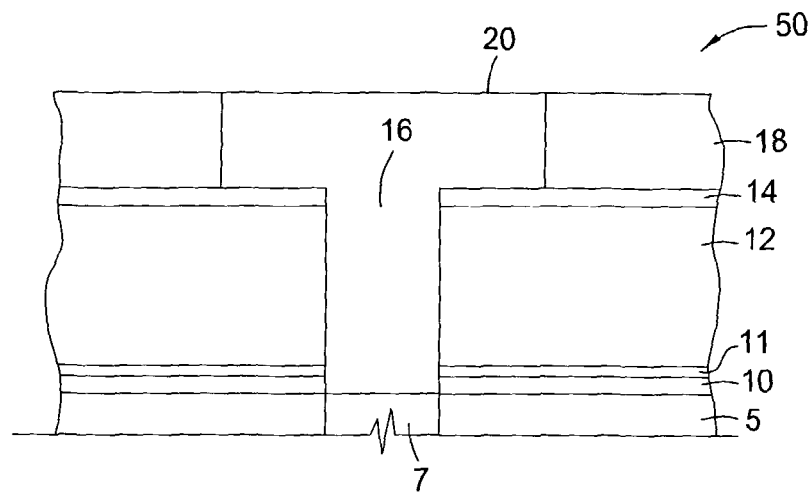
FIG. 1 is a cross sectional view showing a dual damascene structure comprising a low k barrier layer and a low k dielectric layer described herein.

For a further understanding of aspect of the invention, reference should be made to the ensuing detailed description.

DETAILED DESCRIPTION OF THE PREFERRED EMBODIMENT

Aspects of the invention described herein refer to methods and precursors for depositing a silicon carbide barrier layer having a low dielectric constant. The silicon carbide barrier layer may also include hydrogen and may be doped with oxygen, nitrogen, boron, phosphorus, or combinations thereof, to improve film properties. Doped silicon carbide generally includes less than about 15 atomic percent (atomic %) or less of a dopant, such as oxygen, nitrogen, boron, phosphorus, or combinations thereof.

The silicon carbide barrier layer is deposited by reacting a processing gas including an organosilicon compound having the formula $SiH_a(CH_3)_b(C_6H_5)_c$, wherein a is 0 to 3, b is 0 to 3, and c is 1 to 4, in a plasma to form a dielectric layer comprising carbon-silicon bonds and a dielectric constant less than 4, preferably less than about 3.5. A dopant-containing material, such as oxygen ($O_2$) or a siloxane compound for oxygen doping, or borane ($BH_3$) for boron doping, may also be present during the deposition process.

It was unexpectedly and surprisingly discovered that depositing silicon carbide materials with an organosilicon compound having the formula $SiH_a(CH_3)_b(C_6H_5)_c$, wherein a is 0 to 3, b is 0 to 3, and c is 1 to 4, under the processing parameters described herein, produced a silicon carbide film having a dielectric constant of less than 4 with improved barrier layer properties, such as an interlayer diffusion resistance of about 100% greater than silicon carbide film produced by commercially available alkylsilane precursors, such as trimethylsilane (TMS). This is unexpected because it has been observed that phenyl groups increase the porosity of the deposited dielectric material, thereby reducing the interlayer diffusion resistance of the deposited dielectric material. In embodiments in which the barrier layers are deposited adjacent dielectric layers, the barrier layers are preferably deposited adjacent dielectric layers comprising silicon, oxygen, carbon, and hydrogen, which have a dielectric layer of less than about 4, such as less than about 3.

The organosilicon compounds used for barrier layer materials generally include the structure:

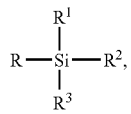

wherein R is a phenyl group, and $R^1$, $R^2$, and $R^3$ are groups containing H, C, and/or Si. The organosilicon compound includes the formula $SiH_a(CH_3)_b(C_6H_5)_c$, wherein a is 0 to 3, b is 0 to 3, and c is 1 to 4, and a+b+c is equal to 4. Examples of suitable precursors derived from this formula include diphenylsilane, dimethylphenylsilane, diphenylmethylsilane, phenylmethylsilane, and combinations thereof. Preferably, b is 1 to 3 and c is 1 to 3. The most preferred organosilicon compounds for deposition as barrier layer materials include organosilicon compounds having the formula $SiH_a(CH_3)_b(C_6H_5)_c$, wherein a is 1 or 2, b is 1 or 2, and c is 1 or 2. Examples of preferred precursors include dimethylphenylsilane and diphenylmethylsilane. The processing gas may also include an inert gas, such as argon (Ar), helium (He), neon (Ne), xenon (Xe), nitrogen ($N_2$), and combinations thereof.

The processing gas may further include compounds having Si—O—Si bonding groups, such as organosiloxane compounds, compounds having Si—N—Si bonding groups, such as silazane compounds, and combinations thereof, for doping the deposited silicon carbide material with oxygen and nitrogen respectively. Alkylsilane precursors, such as trimethylsilane (TMS), may also be used with the organosilicon precursors described herein to modify or change desired film properties.

Precursors with siloxane bonds provide silicon carbide films with bonded oxygen that can reduce the dielectric constant of the film as well as reduce the current leakage of the film. Examples of suitable siloxane precursors include cyclic compounds, for example, 1,3,5,7-tetramethylcyclotetrasiloxane (TMCTS) or octamethylcyclotetrasiloxane (OMCTS), and aliphatic compounds, such as 1,1,3,3-tetramethyldisiloxane (TMDSO).

Compounds having bonded nitrogen, such as in the silazane compounds, can improve the hardness of films as well as reduce the current leakage of the films. Examples of suitable silizane precursors includes aliphatic compounds, such as hexamethyldisilazane and divinyltetramethyldisilizane, as well as cyclic compounds, such as hexamethylcyclotrisilazane.

The barrier layer may further be doped with oxygen, boron, or phosphorous to reduce the dielectric constant of the deposited material. An atomic ratio of dopant to organosilicon compound in the processing gas is about 1:5 or greater, such as between about 1:5 and about 1:100. Phosphorus and/or boron doping of the low k silicon carbide layer may be performed by introducing phosphine ($PH_3$) or borane ($BH_3$), or borane derivatives thereof, such as diborane ($B_2H_6$), into the chamber during the deposition process.

Oxygen doping may occur by optionally including an oxygen-containing gas, for example, oxygen ($O_2$), ozone ($O_3$), nitrous oxide ($N_2O$), carbon monoxide (CO), carbon dioxide ($CO_2$), or combinations thereof. A siloxane compound may also be used with the processing gas for oxygen doping of the deposited material. Nitrogen doping may occur by optionally including a nitrogen-containing gas, for example, ammonia ($NH_3$), nitrogen ($N_2$), a silazane compound, or combinations thereof.

A silicon carbide barrier layer may be deposited in one embodiment by supplying an organosilicon compound, such as diphenylsilane, to a plasma processing chamber at a flow rate between about 10 milligrams/minute (mgm) and about 1500 mgm, optionally supplying a dopant at a flow rate between about 10 sccm and about 2000 sccm, supplying an inert gas at a flow rate between about 1 sccm and about 10000 sccm, maintaining a substrate temperature between about 0° C. and about 500° C., maintaining a chamber pressure below about 500 Torr and an RF power of between about 0.03 watts/cm² and about 1500 watts/cm².

The RF power can be provided at a high frequency such as between 13 MHz and 14 MHz and/or at a low frequency such as between 100 kHz and 1000 kHz. The RF power can be provided continuously or in short duration cycles wherein the power is on at the stated levels for cycles less than about 200 Hz and the on cycles total between about 10% and about 30% of the total duty cycle. The processing gas may be introduced into the chamber by a gas distributor, the gas distributor may be positioned between about 200 mils and about 1200 mils from the substrate surface. The gas distributor may be positioned between about 300 mils and about 800 mils during the deposition process.

A suitable reactor for performing the processes described herein is a DxZ™ chemical vapor deposition chamber commercially available from Applied Materials, Inc., Santa Clara, Calif. An example of a CVD reactor that may be used with the processes herein is described in U.S. Pat. No. 5,000,113, entitled A Thermal CVD/PECVD Reactor and Use for Thermal Chemical Vapor Deposition of Silicon Dioxide and In-situ Multi-step Planarized Process, issued to Wang et al. and assigned to Applied Materials, Inc., the assignee of the present invention.

The above process parameters provide a deposition rate for the silicon carbide layer in the range of about 50 Å/min to about 20,000 Å/min, such as a range between about 100 Å/min and about 3000 Å/min, when implemented on a 200 mm (millimeter) substrate in a deposition chamber available from Applied Materials, Inc., Santa Clara, Calif.

An example of a preferred silicon carbide barrier layer deposition process includes introducing dimethylphenylsilane at about 500 mg/min into the processing chamber, introducing helium at about 1000 sccm into the processing chamber, generating a plasma in the processing chamber by applying 200 watts of RF power, maintaining the substrate temperature at about 350° C., maintaining the chamber pressure at about 6 Torr to deposit a silicon carbide barrier layer. The spacing between the gas distributor and the substrate surface was 450 mil. A silicon carbide layer barrier can be deposited at about 1500 Å/min by this process. The deposited silicon carbide barrier layer exhibited a dielectric constant of about 3.4.

Other examples of preferred silicon carbide barrier layer deposition processes include introducing dimethylphenylsilane at about 100 mg/min into a processing chamber, introducing helium at about 2000 sccm into the processing chamber, generating a plasma in the processing chamber by applying 100, 200, or 300 watts of RF power, maintaining the substrate temperature at about 350° C., and maintaining the chamber pressure at about 6 Torr to deposit a silicon carbide barrier layer. The spacing between the gas distributor and the substrate surface was 650 mil. The deposited silicon carbide barrier layers exhibited dielectric constants of about 3.42 to about 3.96.

Following deposition, the deposited dielectric material, i.e., the deposited silicon carbide barrier layer, may be annealed at a temperature between about 100° C. and about 450° C. for between about 1 minute and about 60 minutes, preferably at about 30 minutes, to reduce the moisture content and increase the solidity and hardness of the dielectric material, if desired. The anneal is preferably performed before the deposition of the next layer which prevents shrinkage or deformation of the dielectric layer. Inert gases, such as argon and helium, may be added to the annealing atmosphere.

The deposited silicon carbide barrier layer may be plasma treated to remove contaminants or otherwise clean the exposed surface of the silicon carbide layer prior to subsequent deposition of materials thereon. The plasma treatment may be performed in the same chamber used to deposit the silicon and carbon containing material. The plasma treatment is believed to improve film stability by forming a protective layer of a higher density material than the untreated silicon carbide material. The plasma treatment is also believed to improve film adhesion to subsequent layers. The higher density silicon carbide material is believed to be more resistive to chemical reactions, such as forming oxides when exposed to oxygen, than the untreated silicon carbide material.

The plasma treatment generally includes providing an inert gas including helium, argon, neon, xenon, krypton, or combinations thereof, of which helium is preferred, and/or a reducing gas including hydrogen, ammonia, and combinations thereof, to a processing chamber. The inert gas or reducing gas is introduced into the processing chamber at a flow rate between about 500 sccm and about 3000 sccm, and generates a plasma in the processing chamber.

The plasma may be generated using a power density ranging between about 0.03 W/cm$^2$ and about 3.2 W/cm$^2$, which is a RF power level of between about 10 W and about 1000 W for a 200 mm substrate. Preferably, at a power level of about 100 watts for a silicon carbide material on a 200 mm substrate. The RF power can be provided at a high frequency such as between 13 MHz and 14 MHz and/or at a low frequency such as between 100 kHz and 1000 kHz. The RF power can be provided continuously or in short duration cycles wherein the power is on at the stated levels for cycles less than about 200 Hz and the on cycles total between about 10% and about 30% of the total duty cycle.

The processing chamber is preferably maintained at a chamber pressure of between about 1 Torr and about 12 Torr, for example about 3 Torr. The substrate is preferably maintained at a temperature between about 200° C. and about 450° C. during the plasma treatment. A substrate temperature of about the same temperature of the silicon carbide deposition process, for example about 290° C., may be used during the plasma treatment. The plasma treatment may be performed between about 2 seconds and about 100 seconds, with a plasma treatment between about 15 seconds and about 60 seconds preferably used. The processing gas may be introduced into the chamber by a gas distributor, the gas distributor may be positioned between about 200 mils and about 1200 mils from the substrate surface. The gas distributor may be positioned between about 300 mils and about 800 mils during the plasma treatment.

However, it should be noted that the respective parameters may be modified to perform the plasma processes in various chambers and for different substrate sizes, such as 300 mm substrates. An example of a plasma treatment for a silicon and carbon containing film is further disclosed in U.S. patent application Ser. No. 09/336,525, entitled, "Plasma treatment to Enhance adhesion and to Minimize Oxidation of Carbon-Containing Layers," filed on Jun. 18, 1999, which is incorporated herein by reference to the extent not inconsistent with the disclosure and claimed aspects of the invention described herein.

The barrier layers are preferably deposited adjacent cap layers and optionally, adjacent dielectric layers comprising silicon, oxygen, and carbon, a dielectric constant of less than about 4, such as less than about 3. The adjacent or nearby dielectric layers for use with the barrier layer material described herein have a carbon content of about 1 atomic percent excluding hydrogen atoms, preferably between about 5 and about 30 atomic percent excluding hydrogen atoms. As used herein, "nearby" dielectric layers refer to dielectric layers that are separated from the barrier layers by an intervening cap layer. The adjacent or nearby dielectric layer may be deposited by oxidizing an organosilane compound in a plasma enhanced chemical vapor deposition technique. For example, a suitable adjacent or nearby dielectric material may be deposited by reacting trimethylsilane and oxygen in a plasma enhanced chemical vapor deposition technique, with the plasma formed under conditions including a high frequency RF power density from about 0.16 W/cm$^2$ to about 0.48 W/cm$^2$.

Examples of methods and uses for the adjacent or nearby dielectric layers comprising silicon, oxygen, and carbon, having a dielectric constant of less than about 3 are more further described in U.S. Pat. No. 6,054,379, issued May 25, 2000, U.S. Pat. No. 6,287,990, issued Sep. 11, 2001, and U.S. Pat. No. 6,303,523, issued on Oct. 16, 2001, which are incorporated by reference herein to the extent not inconsistent with the disclosure and claims described herein.

An adjacent cap layer is deposited on a barrier layer described herein by reacting a processing gas including an oxygen-free organosilicon compound in a plasma to form a silicon carbide cap layer. In one embodiment, the oxygen-free organosilicon compound has the formula $SiH_x(CH_3)_y(C_2H_5)_z$, wherein x is 1 to 3, y is 0 to 3, and z is 0 to 3, and x+y+z is equal to 4. The oxygen-free organosilicon compound may be an alkylsilane, such as methylsilane, dimethylsilane, trimethylsilane, or tetramethylsilane. Preferably, the oxygen-free organosilicon compound is trimethylsilane. The silicon carbide cap layer may also include nitrogen.

In another embodiment, the oxygen-free organosilicon compound may be a phenyl-containing organosilicon compound. The phenyl-containing organosilicon compound may be an organosilicon compound that is used to deposit a silicon carbide barrier layer on which the cap layer is deposited. However, the barrier layer is deposited using processing conditions that allow phenyl groups to remain attached to silicon atoms in the deposited barrier layer. The silicon carbide cap layer is deposited using processing conditions such that substantially no phenyl groups are attached to silicon atoms in the deposited cap layer.

A silicon carbide cap layer may be deposited in one embodiment by supplying an oxygen-free organosilicon compound, such as trimethylsilane, to a plasma processing chamber at a flow rate between about 50 sccm and about 800 sccm, supplying an oxygen-free carrier gas, such as helium, argon, nitrogen, or ammonia at a flow rate between about 50 sccm and about 2000 sccm, maintaining a substrate temperature between about 250° C. and about 450° C., maintaining a chamber pressure between about 3 Torr and about 15 Torr, and a RF power of between about 0.02 watts/cm$^2$ and about 5 watts/cm$^2$, or between about 200 watts and about 800 watts.

The RF power can be provided at a high frequency such as between 13 MHz and 14 MHz and/or at a low frequency such as between 100 kHz and 1000 kHz. The RF power can be provided continuously or in short duration cycles wherein the power is on at the stated levels for cycles less than about 200 Hz and the on cycles total between about 10% and about 30% of the total duty cycle. The processing gas may be introduced into the chamber by a gas distributor, the gas distributor may be positioned between about 200 mils and about 1200 mils from the substrate surface. The gas distributor may be positioned between about 300 mils and about 800 mils during the deposition process.

The cap layer may be deposited in the same chamber in which the barrier layer is deposited. In one embodiment, the cap layer is deposited in a Producer® Chamber, available from Applied Materials, Inc., Santa Clara, Calif. An example of a Producer® Chamber is described in U.S. Pat. No. 5,855,681, which is incorporated by reference herein.

The above process parameters provide a deposition rate for the cap layer in the range of about 100 Å/min to about 1000 Å/min, when implemented on a 200 mm substrate in a deposition chamber.

An example of a preferred silicon carbide cap layer deposition process includes introducing trimethylsilane at about 320 sccm into a processing chamber, introducing helium at about 800 sccm into the processing chamber, generating a plasma in the processing chamber by applying about 400 watts of RF power, maintaining the substrate temperature at about 350° C., maintaining the chamber pressure at about 12 Torr to deposit a silicon carbide cap layer. The spacing between the gas distributor and the substrate surface is about 400 mil. A silicon carbide cap layer may be deposited at about 370 Å/min by this process and have a dielectric constant of about 4.2.

The deposited silicon carbide cap layer may be plasma treated, as described with respect to the deposited silicon carbide barrier layer.

The embodiments described herein for depositing silicon carbide layers adjacent low k dielectric layers are provided to illustrate the invention, the particular embodiment shown should not be used to limit the scope of the invention.

Deposition of a Barrier Layer for a Dual Damascene Structure

An example of a damascene structure 50 that is formed using the silicon carbide material described herein as a barrier layer is shown in FIG. 1. A silicon carbide barrier layer 10 is generally deposited using the precursors according to the processes described herein on the substrate surface to eliminate inter-level diffusion between the substrate and subsequently deposited material. The substrate surface may comprise metal features 7 formed in a dielectric material 5.

A first silicon carbide cap layer 11 is generally deposited on the silicon carbide barrier layer 10 using the precursors described herein for depositing silicon carbide cap layers. A first dielectric layer 12, comprising silicon, oxygen, and carbon, as described herein is deposited on the silicon carbide cap layer 11. An etch stop (or second barrier layer) 14 of a silicon carbide material or oxidized organo silane layer is then deposited on the first dielectric layer 12. The etch stop 14 may include a silicon carbide material deposited from the organosilicon precursors described herein or an oxidized organo silane layer. Alternatively, the etch stop 14 may be a nitrogen containing silicon carbide material. The etch stop 14 is then pattern etched to define the openings of the interconnects or contacts/vias 16.

A second dielectric layer 18 is then deposited over the patterned etch stop. A photoresist is then deposited and patterned by conventional means known in the art to define the contacts/via 16. A single etch process is then performed to define the contact/vias 16 down to the etch stop and to etch the unprotected dielectric exposed by the patterned etch stop to define the contacts/vias 16. One or more conductive materials 20 such as copper are then deposited to fill the formed contacts/vias 16.

A preferred dual damascene structure fabricated in accordance with the invention including a silicon carbide barrier layer and a silicon carbide cap layer deposited by the processes described herein is sequentially depicted schematically in FIGS. 2A-2H, which are cross sectional views of a substrate having the steps of the invention performed thereon.

Figure 2A:
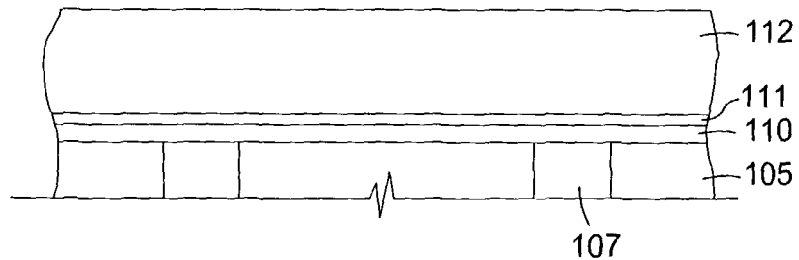
FIGS. 2A-2H are cross sectional views showing one embodiment of a dual damascene deposition sequence of the invention.

As shown in FIG. 2A, a silicon carbide barrier layer 110 is deposited on the substrate surface from the organosilicon precursors described herein for depositing silicon carbide barrier layers. The silicon carbide barrier layer 110 may be doped with oxygen, boron, phosphorus, or combinations thereof. The silicon carbide barrier layer 110 may be deposited by introducing diphenylsilane at about 500 mg/min into the processing chamber, introducing helium at about 500 sccm into the processing chamber, generating a plasma in the processing chamber by applying 100 watts of RF energy, maintaining the substrate temperature at about 290° C., maintaining the chamber pressure at about 3 Torr to deposit a silicon carbide layer. The silicon carbide material is deposited at about 1500 Å/min by this process. The deposited silicon carbide layer has a dielectric constant of about 3.4.

A cap layer 111 of silicon carbide is deposited on the barrier layer 110. The silicon carbide cap layer may be deposited in situ by a nitrogen doped silicon carbide process with the source of nitrogen minimized or eliminated during the deposition process. Preferably, the cap layer 111 is deposited by the processes described herein for depositing silicon carbide cap layers from a gas mixture that comprises an oxygen-free organosilicon compound and is reacted to form a plasma.

The silicon carbide barrier layer 110 and the cap layer 111 may be plasma treated with an inert gas including helium (He), argon (Ar), neon (Ne), and combinations thereof, and/or a reducing gas including hydrogen, ammonia, and combinations thereof. The plasma treatment may be performed in situ with the deposition of the barrier layer and the cap layer. Such a plasma treatment is believed to clean contaminants from the exposed surface of the silicon carbide materials and may be used to stabilize the layers, such that they become less reactive with moisture and/or oxygen under atmospheric condition as well as the adhesion of layers formed thereover.

The plasma process includes a processing gas of helium or a reducing gas, such as hydrogen, at a power level of between about 200 watts and about 800 watts for between about 5 seconds and about 60 seconds for a 200 millimeter substrate. The processing chamber is maintained at a pressure of about 8.7 Torr or less and at a substrate temperature of about the deposition temperature of the layer, for example about 350° C. for dimethylphenylsilane, during the reactive clean process.

The first dielectric layer 112 of interlayer dielectric material is deposited on the cap layer 111 by oxidizing an organosilane or organosiloxane, such as trimethylsilane, to a thickness of about 5,000 to about 15,000 Å, depending on the size of the structure to be fabricated. An example of a low dielectric constant material that may be used as an interlayer dielectric material is Black Diamond™ film commercially available from Applied Materials, Inc., of Santa Clara, Calif. Alternatively, the first dielectric layer may also comprise other low k dielectric material such as a low k polymer material including parylene or a low k spin-on glass such as un-doped silicon glass (USG) or fluorine-doped silicon glass (FSG).

The first dielectric layer 112 may then be treated by a plasma process including helium or a reducing gas, such as hydrogen, at a power level of between about 200 watts and about 800 watts for between about 5 seconds and about 60 seconds for a 200 millimeter substrate. The processing chamber is maintained at a pressure and at a substrate temperature of about the deposition pressure and temperature of the first dielectric layer 112 during the reactive clean process.

Figure 2B:
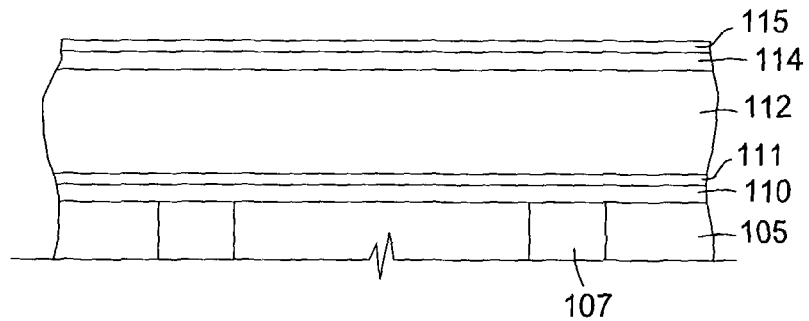
Figure 2C:
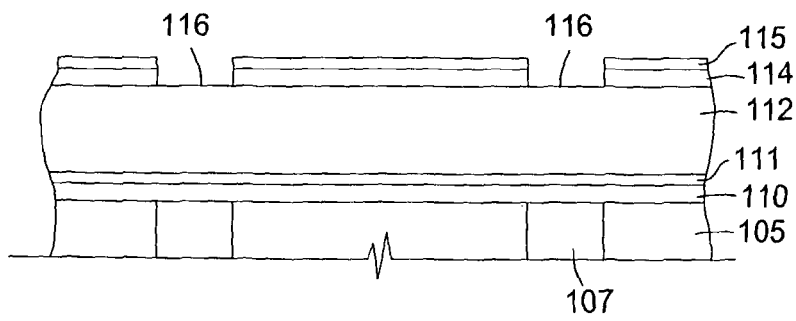

As shown in FIG. 2B, the low k etch stop 114, which may be a silicon carbide material, is then deposited on the first dielectric layer to a thickness of about 200 to about 1000 Å. The low k etch stop 114 may be deposited from the same precursors and by the same process as the silicon carbide barrier layer 110. The low k etch stop 114 may be plasma treated as described herein for the silicon carbide barrier layer 110. The low k etch stop 114 is then pattern etched to define the contact/via openings 116 and to expose first dielectric layer 112 in the areas where the contacts/vias are to be formed as shown in FIG. 2C. Preferably, the low k etch stop 114 is pattern etched using conventional photolithography and etch processes using fluorine, carbon, and oxygen ions. A nitrogen-free silicon carbide or silicon oxide cap layer 115 between about 100 Å and about 500 Å thick, such as between about 30 Å and about 100 Å, may be deposited on the etch stop 114 prior to depositing further materials. A nitrogen-free silicon carbide cap layer 115 may be deposited by the processes described herein for depositing cap layers from a gas mixture comprising an oxygen-free organosilicon compound.

Figure 2D:
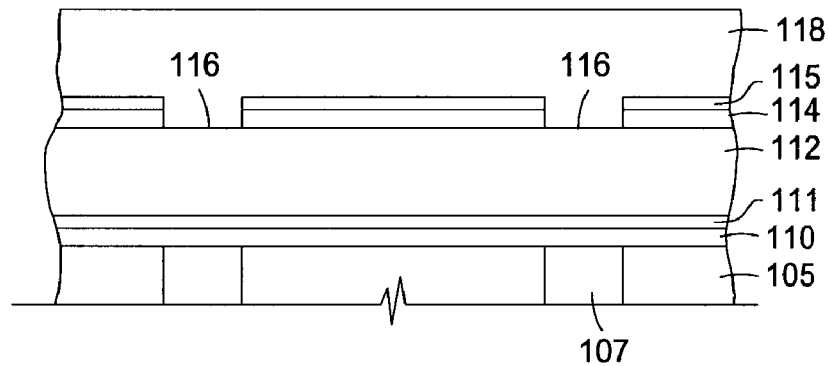

After low k etch stop 114, and the cap layer 115, if present, have been etched to pattern the contacts/vias and the photoresist has been removed, a second dielectric layer 118 of silicon oxycarbide is deposited to a thickness of about 5,000 to about 15,000 Å as shown in FIG. 2D. The second dielectric layer 118 may be plasma treated with helium or a reducing gas, such as hydrogen, at a power level of between about 600 watts and about 800 watts for between about 15 seconds and about 60 seconds for a 200 millimeter substrate. The processing chamber is maintained at a pressure of about 20 Torr or less and at a substrate temperature of about 450° C. or less during the reactive clean process. The plasma treatment is believed to reduce the reactivity of the surface of the layer 118 to subsequently deposited materials.

In an alternative embodiment, a nitrogen-free silicon carbide or silicon oxide cap layer (not shown) between about 100 Å and about 500 Å thick may be deposited on second dielectric layer 118 prior to depositing additional materials, such as photoresist materials. In a further alternative embodiment, a silicon carbide cap layer (not shown) may be deposited from the same precursors and by the same process as the silicon carbide barrier layer 110 on the second dielectric layer 118 prior to depositing additional materials, such as photoresist materials.

Figure 2E:
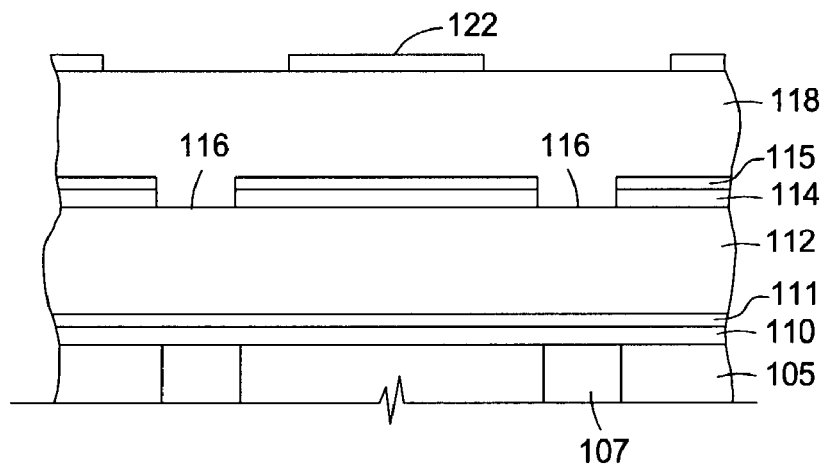
Figure 2F:
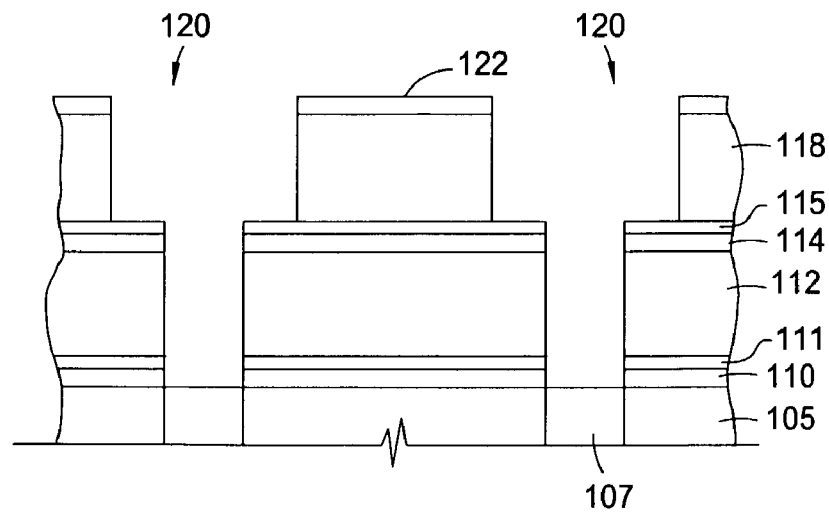

A photoresist material 122 is then deposited on the second dielectric layer 118 (or cap layer) and patterned preferably using conventional photolithography processes to define the interconnect lines 120 as shown in FIG. 2E. The photoresist material 122 comprises a material conventionally known in the art, preferably a high activation energy photoresist, such as UV-5, commercially available from Shipley Company Inc., of Marlborough, Mass. The interconnects and contacts/vias are then etched using reactive ion etching or other anisotropic etching techniques to define the metallization structure (i.e., the interconnect and contact/via) as shown in FIG. 2F. Any photoresist or other material used to pattern the etch stop 114, the cap layer 115, or the second dielectric layer 118 is removed using an oxygen strip or other suitable process.

Figure 2G:
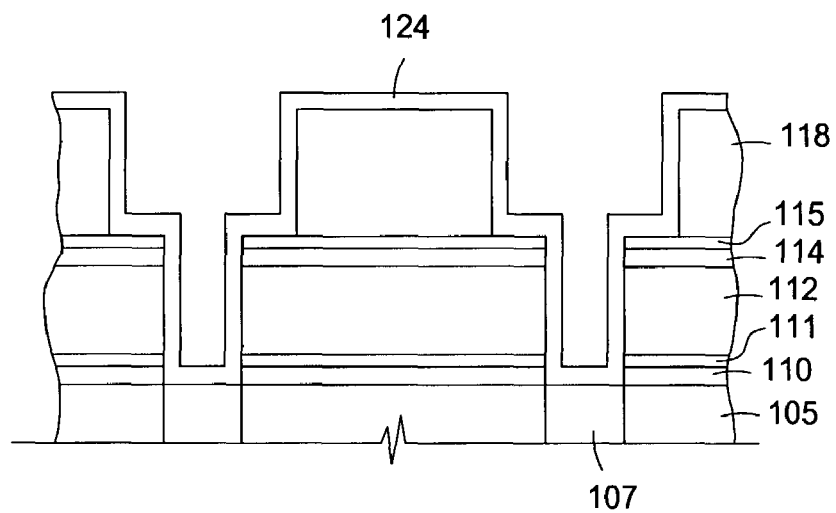
Figure 2H:
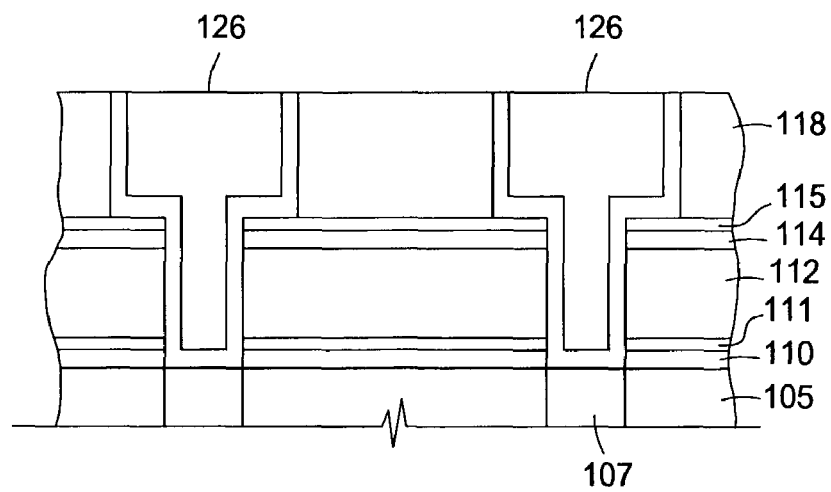

The metallization structure is then formed with a conductive material such as aluminum, copper, tungsten or combinations thereof. Presently, the trend is to use copper to form the smaller features due to the low resistivity of copper (1.7 μΩ-cm compared to 3.1 μΩ-cm for aluminum). Preferably, as shown in FIG. 2G, a suitable barrier layer 124 such as tantalum nitride is first deposited conformally in the metallization pattern to prevent copper migration into the surrounding silicon and/or dielectric material. Thereafter, copper 126 is deposited using either chemical vapor deposition, physical vapor deposition, electroplating, or combinations thereof to form the conductive structure. Once the structure has been filled with copper or other metal, the surface is planarized using chemical mechanical polishing, as shown in FIG. 2H.

EXAMPLES

Organosilicon compounds described herein were deposited as barrier layers on a substrate surface and analyzed. In one example, a silicon carbide barrier film was deposited from a diphenylsilane compound and compared to a silicon carbide barrier film from a conventional silicon carbide precursor, trimethylsilane.

Both diphenylsilane and trimethylsilane precursors were deposited by introducing diphenylsilane or trimethylsilane at about 500 mg/min into the processing chamber, introducing helium at about 500 sccm into the processing chamber, generating a plasma in the processing chamber by applying 100 watts of RF energy, maintaining the substrate temperature at about 290° C., maintaining the chamber pressure at about 3 Torr to deposit a silicon carbide layer. The heater spacing was about 450 mils from the substrate surface.

The deposited films were examined and analyzed for dielectric constant and barrier layer diffusion. The diphenylsilane silicon carbide film had a measured dielectric constant of about 3.4 and the trimethylsilane silicon carbide film had a measured dielectric constant of about 4.3.

The barrier layer properties were tested by a Bias Temperature test, which was performed by forming a damascene device using the above described silicon carbide films and subjecting the deposited films to a substrate temperature of about 275° C. while measuring leakage current for a device. Leakage current increases with degrading barrier layer properties. When leakage current reaches about $10^{-3}$ amps/cm$^2$, the barrier layer is considered to have failed. When 50% of the devices failed under these processing conditions, the time was measured to indicate barrier effectiveness for the deposited films. Comparison of the films indicated that the diphenylsilane silicon carbide had a leakage current of about $1e^{-09}$ amps/cm$^2$ at 1 mega volts/cm (MV/cm) and about $1\ e^{-8}$ amps/cm$^2$ at 2 MW/cm and had a 50% failure rate after about 7.9 hours while the trimethylsilane silicon carbide film had a leakage current of about $1e^{-09}$ amps/cm$^2$ at 1 MV/cm and about $1e^{-6}$ amps/cm$^2$ at 2 MV/cm and had a 50% failure rate after about 4.4 hours.

In a further example, diphenylmethylsilane was used to deposit a silicon carbide barrier layer by introducing the diphenylmethylsilane at about 500 mg/min into the processing chamber, introducing helium at about 500 sccm into the processing chamber, generating a plasma in the processing chamber by applying 100 watts of RF energy, maintaining the substrate temperature at about 290° C. for a diphenylsilane deposited film, maintaining the chamber pressure at about 3 Torr to deposit a silicon carbide layer. The heater spacing was about 450 mils from the substrate surface.

The deposited films were examined and analyzed for dielectric constant and barrier layer diffusion. The diphenylmethylsilane silicon carbide film had a measured dielectric constant of about 3.6 compared to about 4.3 for trimethylsilane deposited silicon carbide films. Comparison of the films indicated that the diphenylmethylsilane silicon carbide had a leakage current of about $3e^{-9}$ amps/cm$^2$ at 1 MW/cm and about $4e^{-8}$ amps/cm$^2$ at 2 MV/cm and had a 50% failure rate after about 10 hours while the trimethylsilane silicon carbide film had a leakage current of about $1\ e^{-09}$ amps/cm$^2$ at 1 MV/cm and about $1\ e^{-6}$ amps/cm$^2$ at 2 MV/cm and had a 50% failure rate after about 4.4 hours.

In a further example, dimethylphenylsilane was used to deposit a silicon carbide barrier layer by introducing the dimethylphenylsilane at about 500 mg/min into the processing chamber, introducing helium at about 1000 sccm into the processing chamber, generating a plasma in the processing chamber by applying 200 watts of RF energy, maintaining the substrate temperature at about 350° C. for a diphenylsilane deposited film, maintaining the chamber pressure at about 6 Torr to deposit a silicon carbide layer. The heater spacing was about 450 mils from the substrate surface.

The deposited films were examined and analyzed for dielectric constant and barrier layer diffusion. The dimethylphenylsilane silicon carbide film had a measured dielectric constant of about 3.5 compared to about 4.3 for trimethylsilane deposited silicon carbide films. Comparison of the films indicated that the dimethylphenylsilane silicon carbide had a leakage current of about $1\ e^{-9}$ amps/cm$^2$ at 1 MW/cm and about $2e^{-8}$ amps/cm$^2$ at 2 MV/cm and had a 50% failure rate after about 11 hours while the trimethylsilane silicon carbide film had a leakage current of about $1\ e^{-09}$ amps/cm$^2$ at 1 MV/cm and about $1\ e^{-6}$ amps/cm$^2$ at 2 MW/cm and had a 50% failure rate after about 4.4 hours.

This data indicates a significant and unexpected improvement in barrier layer properties and dielectric constant for diphenylsilane or alkyl substituted diphenylsilane compounds in comparison to available barrier layer processes.

Data was also collected to compare the properties of the barrier layers described herein with the properties of a combination of the barrier layers and cap layers described herein. A barrier layer was deposited in a Producer® Chamber using a plasma from a flow of dimethylphenylsilane between about 100 mg/min and about 300 mg/min, a flow of helium between about 500 sccm and about 2000 sccm, a spacing between about 350 mils and about 600 mils, and a RF power between about 200 watts and about 500 watts. The barrier layer had a dielectric constant k of 3.4 and a leakage current at 1 MV/cm of $2e^{-9}$ amps/cm$^2$. A silicon carbide cap layer was deposited using a Producer® Chamber using a plasma from a flow of trimethylsilane at 320 sccm, a flow of helium at 800 sccm, a 400 mil spacing, a pressure of 12 Torr, and a RF power of 400 watts. The silicon carbide cap layer had a dielectric constant k of 4.2 and a leakage current at 1 MV/cm of $3.5e^{-9}$ amps/cm$^2$. The combination, i.e., the stack, of the barrier layer and the cap layer had a dielectric constant k of 3.43 and a leakage current at 1 MV/cm of $2e^{-9}$ amps/cm$^2$. Thus, the stack of the barrier layer and the cap layer did not have a significantly higher k than the barrier layer alone.

The barrier layers, cap layers, and combined stack of barrier layers and cap layers described herein were treated with an oxygen ($O_2$) plasma to measure the oxidation of the layers. The results are shown in Table 1.

TABLE 1

| Layer | Thickness (AÅ) | Dielectric constant k before $O_2$ treatment | Thickness of oxidized layer after $O_2$ treatment (Å) | Thickness of non-oxidized layer after $O_2$ treatment (Å) | Dielectric constant k after $O_2$ treatment |
|---|---|---|---|---|---|
| ~1000 Å | 1134 | 4.18 | 108 | 936 | 4.132 |
| cap layer | 1001 | 4.24 | 117 | 810 | 4.285 |
| ~3000 Å | 3558 | | 102 | 3390 | |
| cap layer | 2930 | | 116 | 2714 | |
| barrier layer | 1104 | 3.433 | 101 | 936 | 3.452 |
| +~50 Å | 1028 | 3.417 | 122 | 873 | 3.536 |
| cap layer | | | | | |
| barrier layer | 1181 | 3.428 | 99 | 1045 | 3.554 |
| +~100 Å | 1096 | 3.486 | 108 | 961 | 3.583 |
| cap layer | | | | | |
| ~1000 Å | 1035 | 3.429 | 340 | 558 | |
| barrier layer | 1120 | 3.438 | 392 | 614 | |

Two sets of values are shown for each type of deposited layer, as data was collected from layers deposited in each of the two processing regions of a Producer® Chamber. The thickness of the oxidized layer after the oxygen plasma treatment was significantly larger for barrier layers without cap layers than barrier layers with cap layers, as shown in Table 1. Thus, it is believed that the cap layers described herein reduce the amount, i.e., the depth, of oxidation of the barrier layers described herein.

While the foregoing is directed to preferred embodiments of the present invention, other and further embodiments of the invention may be devised without departing from the basic scope thereof, and the scope thereof is determined by the claims which follow.

What is claimed is:

1. A method for processing a substrate, comprising:
forming a barrier layer in a dual damascene structure, wherein the barrier layer is directly formed on a substrate surface comprising metal features, and the forming comprises:
depositing a silicon carbide barrier layer on the substrate by introducing a first processing gas mixture comprising dimethylphenylsilane and a nitrogen containing compound into a processing chamber, and reacting the first processing gas mixture to deposit the silicon carbide barrier layer, wherein the silicon carbide barrier layer has a dielectric constant of less than 4; and
depositing a silicon carbide cap layer directly on the silicon carbide barrier layer by introducing a second processing gas mixture comprising trimethylsilane into the processing chamber, and reacting the second processing gas mixture to deposit the silicon carbide cap layer in the processing chamber, wherein the silicon carbide cap layer has a thickness between about 50 Å to about 100 Å.

2. The method of claim 1, wherein the second processing gas mixture further comprises helium.

3. The method of claim 1, wherein the silicon carbide cap layer is deposited under plasma conditions comprising a high frequency RF power density from about 0.02 W/cm$^2$ to about 5 W/cm$^2$.

4. The method of claim 1, wherein the trimethylsilane of the second processing gas mixture is flowed into the chamber at a flow rate of between about 50 sccm and about 800 sccm.

5. The method of claim 1, wherein the second processing gas mixture further comprises an oxygen-free gas selected from the group of argon, helium, nitrogen, and ammonia.

6. The method of claim 5, wherein the oxygen-free gas of the second processing gas mixture is flowed into the chamber at a flow rate of between about 50 sccm and about 2000 sccm.

7. The method of claim 1, wherein the reacting the first processing gas mixture comprises reacting the dimethylphenylsilane of the first processing gas mixture with an oxygen-containing compound selected from the group of oxygen, ozone, a siloxane, and combinations thereof.

8. The method of claim 1, wherein the first processing gas mixture further includes a dopant component selected from the group of a nitrogen-containing compound, a boron-containing compound, a phosphorus-containing compound, and combinations thereof.

9. The method of claim 8, wherein the nitrogen-containing compound is selected from the group of nitrogen gas, ammonia, a silazane, and combinations thereof.

10. The method of claim 1, wherein the first processing gas mixture further comprises an inert gas selected from the group of argon, helium, neon, xenon, or krypton, and combinations thereof.

11. The method of claim 1, wherein the silicon carbide barrier layer comprises less than about 15 atomic percent of oxygen.

12. The method of claim 1, further comprising depositing a dielectric layer directly on the silicon carbide cap layer, wherein the dielectric layer has a dielectric constant less than about 4.

13. The method of claim 12, wherein the dielectric layer has a carbon content between about 5 and about 30 atomic percent excluding hydrogen atoms.

14. The method of claim 13, wherein the dielectric layer is deposited by oxidizing an organosilane or organosiloxane compound in a plasma enhanced chemical vapor deposition technique.

15. The method of claim 14, wherein the dielectric layer is deposited by reacting trimethylsilane and oxygen in a plasma enhanced chemical vapor deposition technique.

16. The method of claim 15, wherein the dielectric layer is deposited under plasma conditions comprising a high frequency RF power density from about 0.16 W/cm$^2$ to about 0.48 W/cm$^2$.

17. The method of claim 1, wherein the silicon carbide cap layer has substantially no phenyl groups attached to silicon atoms.

18. A method for processing a substrate, comprising:
forming a barrier layer in a dual damascene structure, wherein the barrier layer is directly formed on a substrate surface comprising metal features, and the forming comprises:
depositing a silicon carbide barrier layer on the substrate by introducing a first processing gas mixture comprising dimethylphenylsilane and a dopant component containing nitrogen into a processing chamber and reacting the first processing gas mixture to deposit the silicon carbide barrier layer, wherein the silicon carbide barrier layer has a dielectric constant of less than 4; and
depositing a silicon carbide cap layer directly on the silicon carbide barrier layer by introducing a second processing gas mixture comprising trimethylsilane into the processing chamber, and reacting the second processing gas mixture to deposit the silicon carbide cap layer in the processing chamber, wherein the silicon carbide cap layer comprises nitrogen, and the silicon carbide cap layer has a thickness between about 50 Å to about 100 Å.

19. The method of claim 18, wherein the second processing gas mixture comprises a source of nitrogen.

20. The method of claim 18, wherein the dopant component supplied in the first processing mixture further includes an oxygen-containing compound, a boron-containing compound, a phosphorus-containing compound, and combinations thereof.

21. The method of claim 18, wherein the silicon carbide barrier layer comprises less than about 15 atomic percent of oxygen.

22. The method of claim 18, further comprising depositing a dielectric layer directly on the silicon carbide cap layer, wherein the dielectric layer has a dielectric constant less than about 3.

23. The method of claim 22, wherein the dielectric layer comprises silicon, oxygen, and carbon.

24. The method of claim 23, wherein the dielectric layer is deposited by oxidizing an organosilane or organosiloxane compound in a plasma enhanced chemical vapor deposition technique.

25. The method of claim 18, wherein the silicon carbide cap layer has substantially no phenyl groups attached to silicon atoms.

26. A method for processing a substrate, comprising:
forming a barrier layer in a dual damascene structure, wherein the barrier layer is directly formed on a substrate surface comprising metal features, and the forming comprises:
depositing a silicon carbide barrier layer on the substrate by introducing a first processing gas mixture comprising dimethylphenylsilane and a nitrogen containing gas into a processing chamber and reacting the first processing gas mixture to deposit the silicon carbide barrier layer, wherein the silicon carbide barrier layer has a dielectric constant of less than 4; and depositing a silicon carbide cap layer directly on the barrier layer by introducing a second processing gas mixture comprising trimethylsilane and ammonia into the processing chamber, and reacting the second processing gas mixture to deposit the silicon carbide cap layer in the processing chamber, wherein the silicon carbide cap layer comprises nitrogen, and the silicon carbide cap layer has a thickness between about 50 Å to about 100 Å.

27. The method of claim 26, further comprising depositing a dielectric layer directly on the silicon carbide cap layer, wherein the dielectric layer has a dielectric constant less than about 3.

28. The method of claim 27, wherein the dielectric layer comprises silicon, oxygen, and carbon.

29. The method of claim 28, wherein the dielectric layer is deposited by oxidizing an organosilane or organosiloxane compound in a plasma enhanced chemical vapor deposition technique.

30. The method of claim 26, wherein the silicon carbide cap layer has substantially no phenyl groups attached to silicon atoms.

31. The method of claim 26, wherein the second gas mixture further comprises helium.

* * * * *

UNITED STATES PATENT AND TRADEMARK OFFICE
CERTIFICATE OF CORRECTION

| | | |
|---|---|---|
| PATENT NO. | : 7,749,563 B2 | Page 1 of 1 |
| APPLICATION NO. | : 10/266551 | |
| DATED | : July 6, 2010 | |
| INVENTOR(S) | : Zheng et al. | |

It is certified that error appears in the above-identified patent and that said Letters Patent is hereby corrected as shown below:

Column 12, Line 44, please delete "(AÅ)" and insert --(Å)-- therefor.

Signed and Sealed this

Second Day of November, 2010

David J. Kappos
*Director of the United States Patent and Trademark Office*